United States Patent [19]
Komatsu et al.

[11] 3,952,292
[45] Apr. 20, 1976

[54] MAGNETIC BUBBLE DEVICE DRIVER

[75] Inventors: Masahiro Komatsu, Inagi; Sakan Takai, Kawasaki; Harumi Maegawa, Kawasaki; Masaki Takasu, Kawasaki, all of Japan

[73] Assignee: Fujitsu Ltd., Kawasaki, Japan

[22] Filed: Dec. 10, 1974

[21] Appl. No.: 531,321

[30] Foreign Application Priority Data
Dec. 14, 1973 Japan.............................. 48-138686

[52] U.S. Cl............................................. 340/174 TF
[51] Int. Cl.[2]......................................... G11C 11/14
[58] Field of Search........................... 340/174 TF

[56] References Cited
UNITED STATES PATENTS

| | | |
|---|---|---|
| 3,720,883 | 3/1973 | Hess, Jr. et al............... 340/174 TF |
| 3,763,478 | 10/1973 | Yoshizawa et al............ 340/174 TF |
| 3,866,145 | 2/1975 | Hess, Jr. et al............... 340/174 TF |

OTHER PUBLICATIONS

IEEE Transactions on Magnetics, Vol. Mag 10, No. 3, Sept., 1974, pp. 750–752.

*Primary Examiner*—James W. Moffitt
*Attorney, Agent, or Firm*—Daniel Jay Tick

[57] ABSTRACT

Out-of-phase currents of trapezoidal or triangular waveshape are supplied to the drive coils of a magnetic bubble device. The induced magnetic field of the magnetic bubble device rotates at a uniform constant speed and has a linearly varying locus.

4 Claims, 58 Drawing Figures

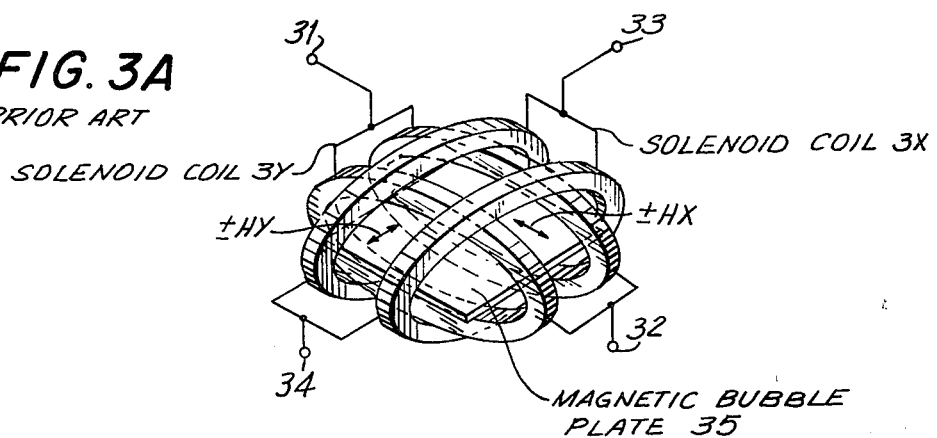
FIG. 3A
PRIOR ART
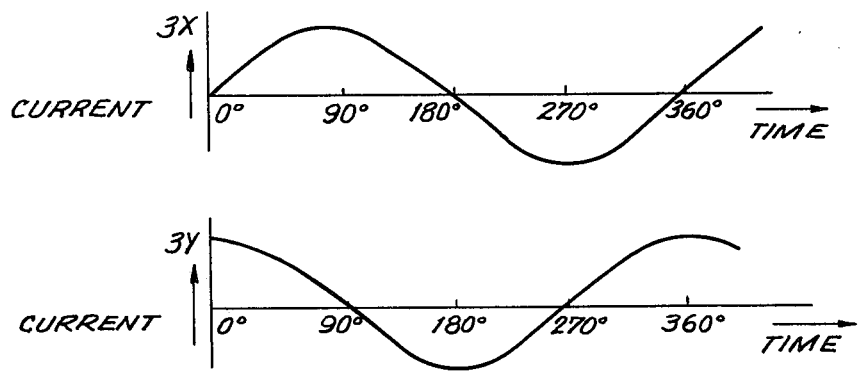
FIG. 3B
PRIOR ART
FIG. 3C
PRIOR ART
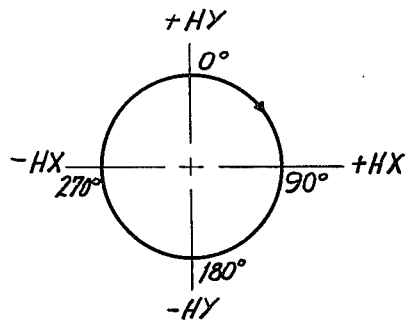
FIG. 3D

FIG. 4B  CLOCK

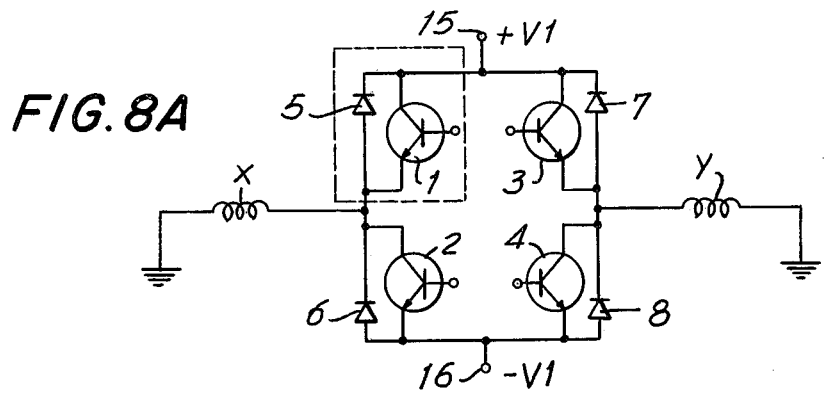
FIG.8A
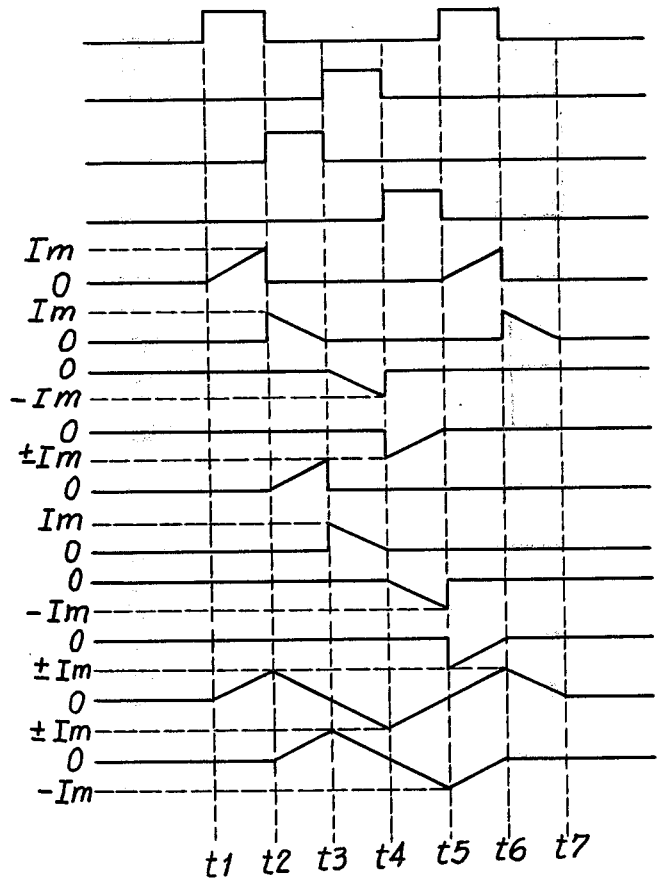
FIG.8B
FIG.8C
FIG.8D
FIG.8E
FIG.8F
FIG.8G
FIG.8H
FIG.8I
FIG.8J
FIG.8K
FIG.8L
FIG.8M
FIG.8N
FIG.8P

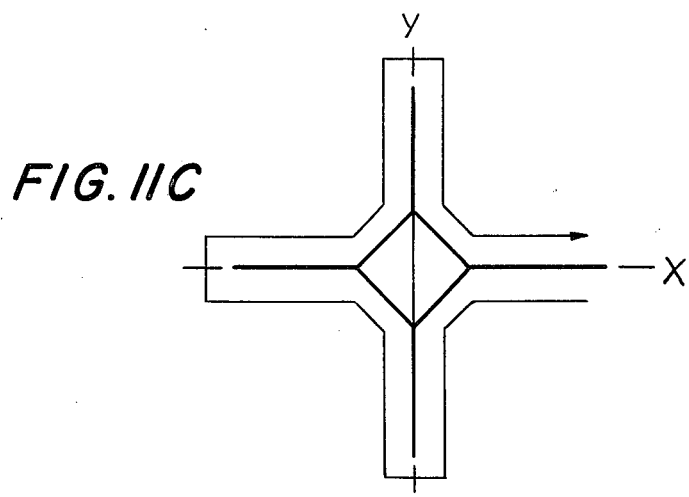
FIG. 11C
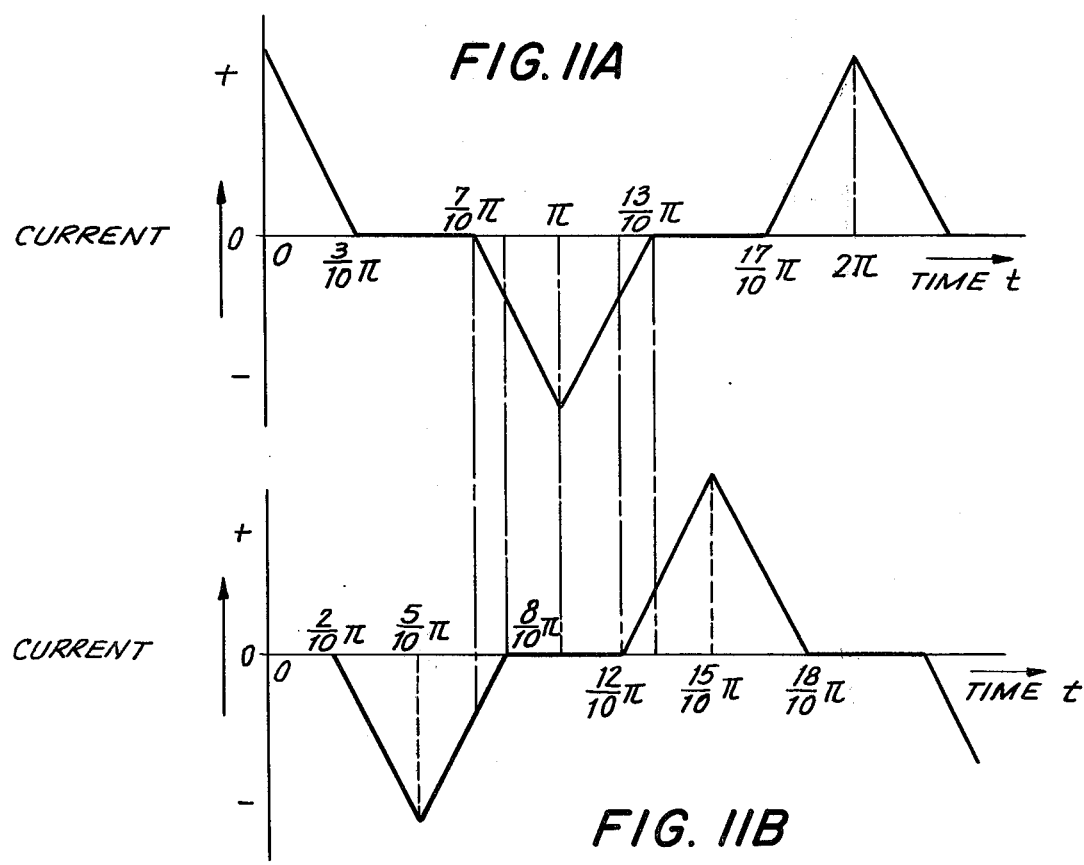
FIG. 11A
FIG. 11B

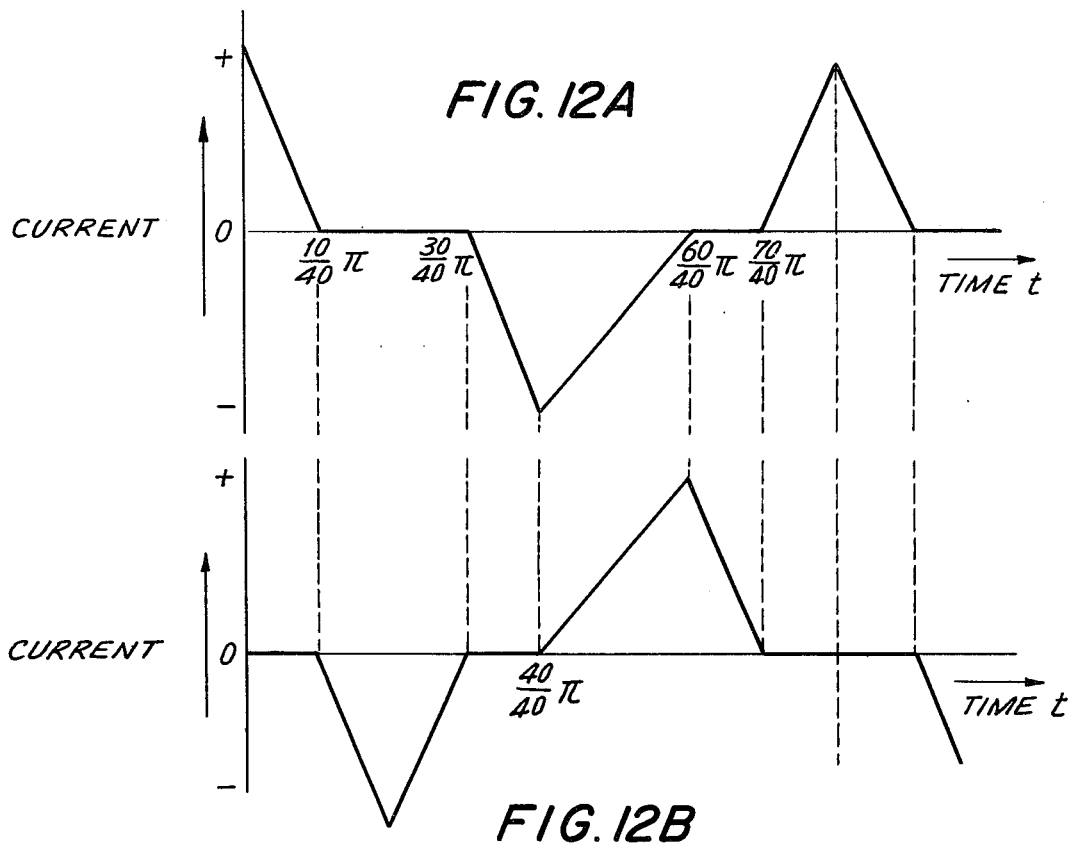
*FIG.12A*
*FIG.12B*
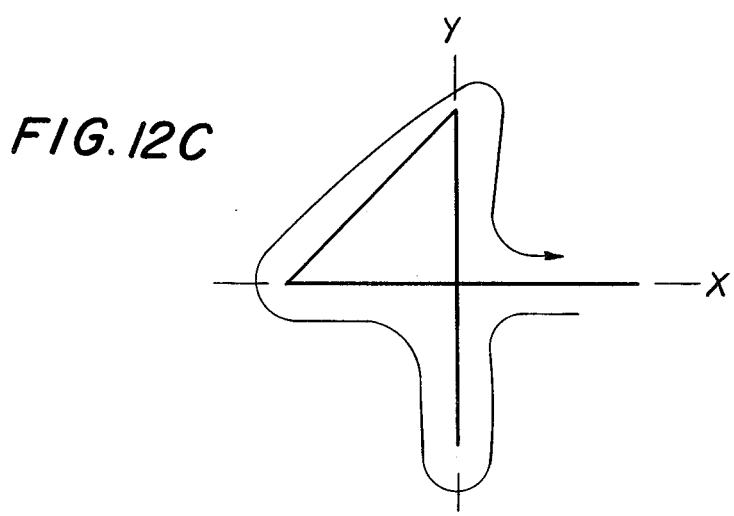
*FIG.12C*

MAGNETIC BUBBLE DEVICE DRIVER

CROSS-REFERENCE TO RELATED APPLICATIONS

Copending patent application Ser. No. 528,504, filed Nov. 29, 1974, discloses magnetic bubble devices of the type driven by the magnetic bubble device driver of the present invention.

BACKGROUND OF THE INVENTION

1. Field of the Invention

The present invention relates to a magnetic bubble device driver. More particularly, the invention relates to a driver for magnetic bubble devices.

Magnetic bubble device drivers known in the art supply two out-of-phase sine wave currents to the X-type and Y-type orthogonal coils positioned in operative proximity with a magnetic bubble chip, so that an induced rotating magnetic field will trace a circular locus and magnetic bubbles in the chip will be transferred. Since the circular locus induced by sine wave currents provides a constant speed of rotation, good behavior is expected from the magnetic bubbles. However, when the magnetic bubbles are used in a memory system, it is necessary to start and stop the rotating magnetic field and to reverse the direction thereof so that access time may be reduced and/or power consumption of the driver may be reduced. To accomplish such control of the magnetic field, the sine wave generator requires very complicated control.

The present invention relates to a device which utilizes the cylindrical magnetic domain or magnetic bubble produced when a bias magnetic field is applied to single crystal of orthoferrite or garnet grown on a thin sheet, or to an amorphous magnetic thin sheet or other magnetic thin sheet which provides uniaxial magnetic anisotropy. This is the magnetic bubble chip of a magnetic bubble device. More particularly, the invention relates to a driver for a magnetic bubble device utilizing magnetic bubbles. The driver of the invention provides a rotating magnetic field substantially parallel to the surface of the magnetic bubble chip.

2. Description of the Prior Art

A cylindrical magnetic domain or magnetic bubble is produced when a bias magnetic field is applied in an easy magnetization direction normal to the plane of the sheet of orthoferrite, garnet or other uniaxial magnetic anisotropic single crystal. The sheet is thin and has a magnetizable axis normal to the plane of the sheet. The sheet may be grown. The bias magnetic field may be applied to the plane of a uniaxial magnetically anisotropic armophous magnetic film whose easy magnetization axis is normal to the plane thereof. The magnetic bubble so produced may be moved, transported or transferred by producing a gradient of the magnetic field normal to the plane of the sheet. This effect is described in detail in a textbook entitled, "Domain Behavior in Some Transparent Magnetic Oxides", by Remeika and H. J. Williams, et al., Journal of Applied Physics, 1959, Vol. 30, pages 215 to 225, and in a textbook entitled, "Properties and Device Application of Magnetic Domain in Orthoferrites" by A. H. Bobeck, Bell System Technical Journal, Vol. 46, pages 1901 to 1925.

Logic, operator, memory, or other devices, applicable to digital data processing may utilize magnetic bubbles. Such devices provide correspondence between the presence and absence of the magnetic bubble to binary information. The devices combine various control functions, such as generation, transfer, sensing, elimination and splitting of the magnetic bubbles.

There have been many proposals for controlling magnetic bubbles. The most popular one is that disclosed by U.S. Pat. Nos. 3,534,347 and 3,543,252, by which various Permalloy patterns formed on a magnetic bubble chip are controlled by a rotating magnetic field parallel to the plane of the magnetic bubble chip. According to this method, Permalloy patterns such as, for example, T-shaped and I-shaped patterns formed on a magnetic bubble chip are externally driven by a rotating magnetic field extending parallel to the plane of the magnetic bubble chip so that magnetic bubbles may be attracted by magnetic poles produced on the Permalloy patterns. The rotating magnetic field thereof is induced by two out-of-phase sine wave currents supplied to two substantially perpendicularly positioned solenoid coils. A magnetic bubble produced inside the coils is controlled by a rotating magnetic field of circular locus.

The circular locus of the rotary magnetic field is favorable due to a uniform speed of rotation thereof. However, the circular locus induced by sine wave currents is disadvantageous for the desired application. It is very likely that start or stop or reverse rotation control of the rotating magnetic field, so that access time may be reduced or power consumption of the system may be decreased, creates problems. The start, stop or reverse control of the rotating magnetic field by sine wave currents becomes very complicated when the transient response of the circuit is considered.

In another proposal, a capacitor is connected in parallel with each of the coils which produce the rotating magnetic field, so that resonance of the coil and capacitor may vary the supplied square wave control current to sine wave current. However, this proposal also requires a complicated set of operating conditions such as, for example, the timing of a square wave control current or the duration thereof.

The start, stop or reverse control of the rotating magnetic field may be simplified by supplying two out-of-phase square wave currents to the coils, so that the locus of the rotating magnetic field may form a square. However, the speed of rotation of the magnetic field formed by square wave currents is not uniform, but varies in a step-like manner. This effect is not favorable for controlling a magnetic bubble, because a sudden change in speed of the locus is equivalent to a high-speed magnetization of the Permalloy pattern and the magnetic bubble. Considering the mobility of the domain wall of the magnetic bubble chip and the characteristics of the Permalloy pattern, the sudden change in speed of the locus lowers the operation margin of the system.

The principal object of the invention is to provide a magnetic bubble device driver which very easily and simply controls start, stop and reverse of the magnetic field.

An object of the invention is to provide a magnetic bubble device driver which produces a magnetic field which rotates at a uniform constant speed, which driver has a margin of operation free from deterioration.

Another object of the invention is to provide a magnetic bubble device driver comprising a very simple circuit.

Still another object of the invention is to provide a magnetic bubble device driver of simple structure, which is inexpensive in manufacture and functions efficiently, effectively and reliably to produce a magnetic field which rotates at a uniform constant speed and has a linearly varying locus.

Yet another object of the invention is to provide a magnetic bubble device driver having reduced power consumption of the drive coils.

BRIEF SUMMARY OF THE INVENTION

The driver of the invention fully solves the aforedescribed problems of magnetic bubble device drivers which use sine or square wave currents for producing rotating magnetic fields by supplying two out-of-phase trapezoidal or triangular currents to the drive coils so that the locus of the rotary magnetic field produced by the trapezoidal or triangular currents is used as the locus of the rotary magnetic field to drive the magnetic bubble of the device. The trapezoidal or triangular currents supplied to the drive coils provide a speed of rotation of the magnetic field which is uniform, a locus thereof which is varied linearly, very simple start, stop and reverse control, a very wide margin of operation of the entire magnetic bubble driver, and a very simple structure of the driver circuit.

The magnetic bubble device driver of the invention is for a magnetic bubble device having a magnetic bubble chip consisting of magnetic material for producing a magnetic bubble. The magnetic bubble chip has a surface. At least a pair of drive coils cross each other and produce a rotating magnetic field substantially parallel to the surface of the magnetic bubble chip.

In accordance with the invention, a magnetic bubble device driver comprises circuit means for supplying drive currents to the drive coils of a magnetic bubble device. The drive currents have predetermined waveshapes and produce a rotating magnetic field for driving the magnetic bubble of the magnetic bubble device. The magnetic field rotates at a uniform constant speed and has a linearly varying locus.

The circuit means includes means for producing out-of-phase trapezoidal currents and the drive currents have trapezoidal waveshapes. The circuit means produces a rotating magnetic field having a rectangular locus.

The circuit means includes means for producing out-of-phase triangular currents and the drive currents have triangular waveshapes. The circuit means produces a rotating magnetic field having a rectangular locus.

The circuit means comprises a pair of circuit networks each connected to a corresponding one of the coils and each comprising first and second switching means, a source of positive voltage and a source of negative voltage. Electrically conductive means connect the source of positive voltage to the corresponding coil via the first switching means and connect the source of negative voltage to the corresponding coil via the second switching means. The first and second switching means alternately connect the sources of positive and negative voltage to the corresponding coil and utilize specific approximately linear voltage-current characteristics of the corresponding coil in a manner whereby the speed of rotation of the magnetic field is uniform and constant and the locus of the magnetic field varies linearly.

BRIEF DESCRIPTION OF THE DRAWINGS

In order that the invention may be readily carried into effect, it will now be described with reference to the accompanying drawings, wherein:

FIG. 3A is a perspective view of the rotating magnetic field produced by the magnetic bubble device of FIGS. 2A and 2B;

FIGS. 3B and 3C are graphical presentations of currents supplied to the drive coils of the magnetic bubble device of FIGS. 2A and 2B;

FIG. 3D illustrates the magnetic field of the magnetic bubble device of FIGS. 2A and 2B;

FIGS. 4B and 4H are graphical presentations of waveforms appearing at different points of the circuit of FIG. 4A;

FIG. 8A is a circuit diagram of an embodiment of the magnetic bubble device driver circuit of the invention;

FIG. 8B to 8P are graphical presentations of waveforms appearing at different points of the circuit of FIG. 8A;

FIGS. 11A and 11B are graphical presentations of deformed triangular current waveforms supplied to the drive coils of a magnetic bubble device, in accordance with the invention;

FIG. 11C illustrates the locus of the rotating magnetic field produced by the waveforms of FIGS. 11A and 11B;

FIGS. 12A and 12B are graphical presentations of deformed triangular current waveforms supplied to the drive coils of a magnetic bubble device, in accordance with the invention;

FIG. 12C illustrates the locus of the rotating magnetic field produced by the waveforms of FIGS. 12A and 12B;

DETAILED DESCRIPTION OF THE INVENTION

Figure 1A:
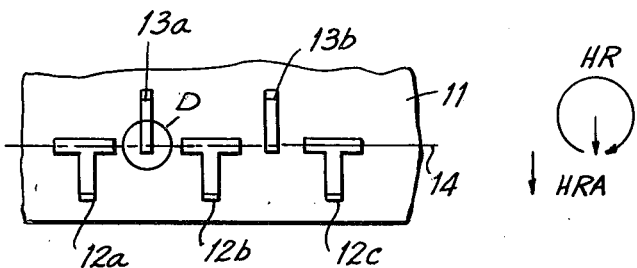
FIGS. 1A, 1B, 1C and 1D are schematic diagrams illustrating a common method of the prior art for shifting a magnetic bubble.
Figure 1B:
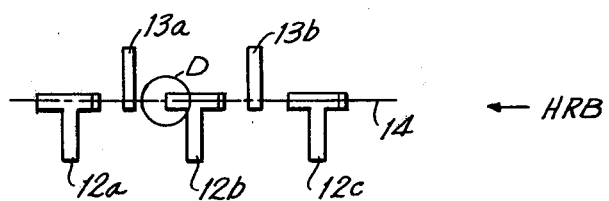

FIGS. 1A, 1B, 1C and 1D are a typical example of the control of the transfer, shifting, transport, movement, or the like of magnetic bubbles. In FIG. 1A, a magnetic bubble chip 11 is cut from or grown on a thin sheet of orthoferrite, garnet, or other type of single crystal having uniaxial magnetic anisotropy. The crystal is on a silicon base plate, so that the single crystal may be easily magnetized in a direction normal to the plane of sheet. A magnetic bubble D is produced when the magnetic bubble chip 11 is driven by a bias magnetic field which is normal to plane of said chip.

Figure 1C:
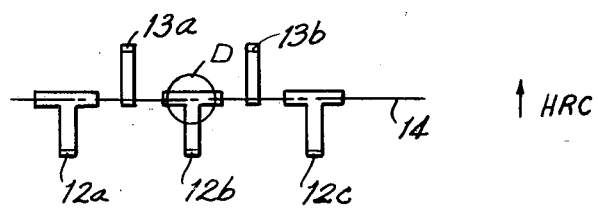
Figure 1D:
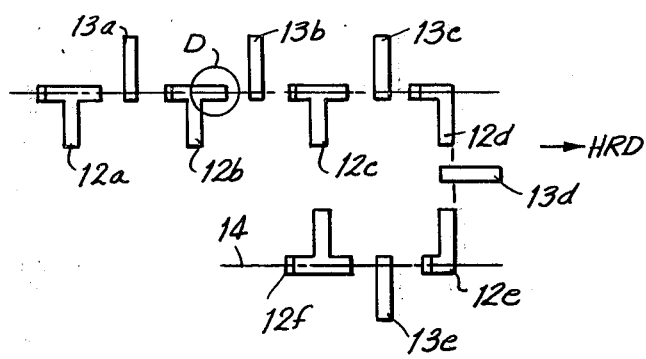

T-shaped Permalloy patterns 12a, 12b, 12c . . . and I-shaped Permalloy patterns 13a, 13b, 13c . . . are provided on the magnetic bubble chip 11 by vacuum evaporation or other suitable means. The chip 11 has a data transfer line 14. When the magnetic bubble chip 11 is subjected to a rotating magnetic field HR which is parallel to the plane of the chip, a magnetic bubble D is attracted by negative magnetic poles produced on the Permalloy patterns 12a to 12c and 13a to 13c, and is transferred along the transfer line 14. Thus, for example, when the rotating magnetic field is RHA, as shown in FIG. 1A, the Permalloy pattern 13a is magnetized and the magnetic bubble is positioned as shown in FIG. 1A, attracted by the negative magnetic pole produced on pattern 13a. When the rotating magnetic field is turned clockwise and positioned as shown by HRB in FIG. 1B, a negative magnetic pole is produced on the pattern 12b, thereby moving the magnetic bubble to the position shown in FIG. 1B. Similarly, as the rotating magnetic field is turned clockwise, as shown by HRC and HRD, as shown in FIGS. 1C and 1D, the magnetic bubble D is moved to the right, as shown in FIGS. 1C and 1D.

Figure 2B:
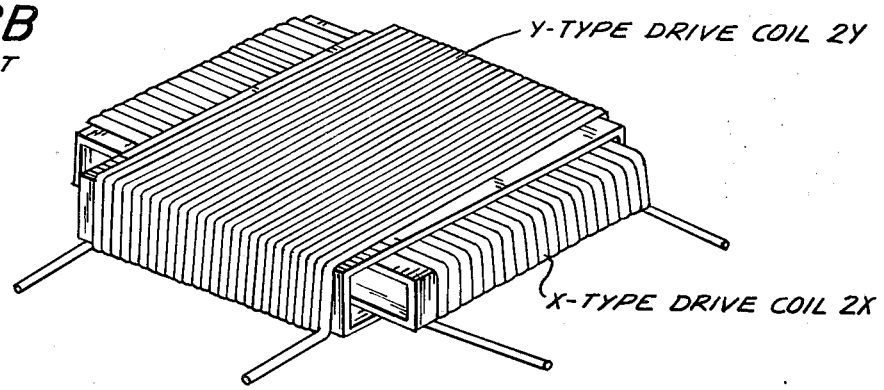
FIG. 2B is a perspective view of the embodiment of FIG. 2A in assembled condition.
Figure 2A:
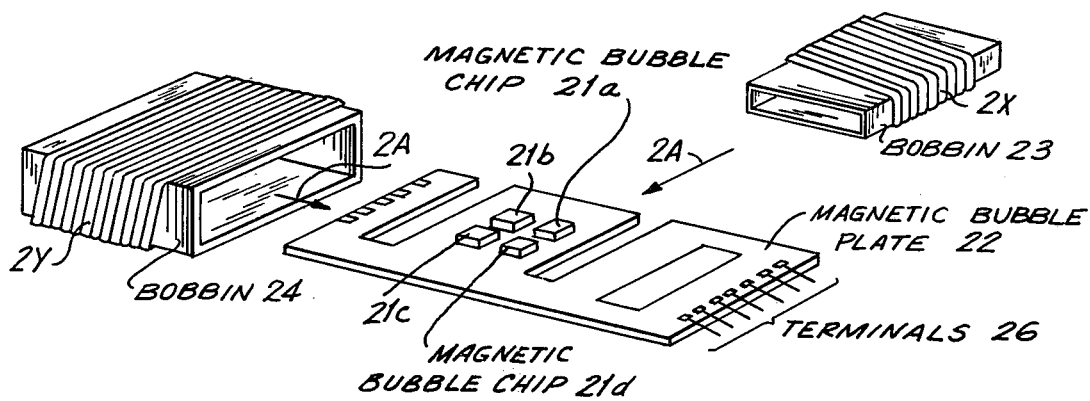
FIG. 2A is an exploded perspective view of an embodiment of a conventional magnetic bubble device.

FIGS. 2A and 2B show a magnetic bubble device using a magnetic bubble chip. In FIG. 2A, magnetic bubble chips 21a, 21b, 21c and 21d are mounted on a magnetic bubble plate 22. At the rear of the plate 22, input and output lines and control lines (not shown in the FIGS.) are provided for the magnetic bubble chips 21a to 21d, by means of printed circuitry and extend to input and output and control terminals 26.

A drive coil 2X for the magnetic bubble plate 22 is wound on a bobbin 23. A drive coil 2Y is wound on a bobbin 24. The drive coil 2X is inserted into slots formed in the magnetic bubble plate 22, as indicated by an arrow 2A of FIG. 2A. The magnetic bubble chips 21a to 21d are thus positioned inside the drive coil 2X. Then, the drive coil 2Y is moved in the direction indicated by an arrow 2B of FIG. 2A. As a result, the magnetic bubble chips 21a to 21d are positioned inside the drive coils 2X and 2Y, which are substantially perpendicular to each other, as shown in FIG. 2B. The magnetic bubble plate 22 is not shown in FIG. 2B in order to maintain the clarity of illustration.

FIGS. 3A, 3B, 3C and 3D show the rotating magnetic field produced by the magnetic bubble device of FIGS. 2A and 2B and the currents supplied to the coils of such device. The magnetic field is parallel to the plane of the magnetic bubble chips 2a to 2d.

FIG. 3A shows the relation of a pair of solenoid coils 3X and 3Y to a magnetic bubble plate 35 having magnetic bubble chips thereon (not shown in the FIGS.) A sine wave current, as shown in FIG. 3B, is supplied to terminals 33 and 34 of the coil 3X and a sine wave current having a phase leading the sine wave of FIG. 3B by 90°, as shown in FIG. 3C, is supplied to terminals 31 and 32 of the coil 3Y. The wave of FIG. 3C is thus a cosine wave. A magnetic field operating on the magnetic bubble plate 35 is determined by a vector $\pm HX$ of the magnetic field produced by the coil 3X and a magnetic field vector $\pm HY$ produced by the coil 3Y. Therefore, the locus of the rotating magnetic field in the magnetic bubble plate 35 traces a circle shown in FIG. 3D, and the circular magnetic field rotates clockwise, as indicated by the arrow in FIG. 3D.

The current waveforms shown in FIGS. 3B and 3C may be obtained by loading the circuit with a resonant circuit and exciting the resonant tank with pulse current. The principle of operation of a circuit for producing such waveforms is shown in FIGS. 4A and 4B.

Figure 4A:
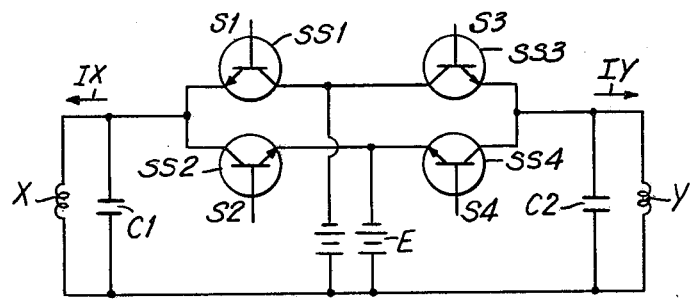
FIG. 4A is a circuit diagram of an embodiment of a circuit for producing the sine wave and cosine wave shown in FIGS. 3B and 3C.

The current flowing in the coil X or the coil Y is a sine wave of fixed frequency and amplitude, and the load is an LC resonant circuit, as shown in FIG. 4A. In other words, resonant circuits of the same operating frequency are formed by a coil X and a capacitor C1, and by a coil Y and a capacitor C2, and are used as the load of an excitation circuit comprising four excitation switches SS1, SS2, SS3 and SS4 and a power supply E.

The excitation switches SS1 and SS4 are closed in sequence, instantaneously synchronized with a clock signal (FIG. 4B) having a frequency preset to four times the resonant frequency of circuit. The resonant circuits are excited at a constant voltage, and 90° out-of-phase sine wave currents IX and IY flow through the coils X and Y, respectively. The circular locus of the rotating magnetic field, shown in FIG. 3D, may be easily obtained by supplying 90° out-of-phase sine wave currents to the coils X and Y.

A uniform speed of rotation of the circular rotating magnetic field locus of FIG. 3D provides very stable behavior of the magnetic bubbles. However, driving the coils by sine waves results in the following disadvantage. When the magnetic bubbles are utilized in a memory unit or other data processing device, it is a common practice to provide start, stop and reversal control of the rotating magnetic field in order to reduce the access time of the device, decrease the power consumption of the system, or to enable reversed gating to select the transfer path of the magnetic bubbles. However, the start, stop and reverse control of the magnetic field results in a very complicated configuration of the waveform producing circuit of FIG. 4A. Considerations for the transient response of the circuit result in greater complications of the control circuit, necessitating very critical setting of timing and duration for the input pulses S1 to S4 of FIGS. 4C to 4F. The aforedescribed troublesome problems may be solved, and start, stop, reverse, or other control may be facilitated by supplying square wave current to each drive coil.

Figure 5A:
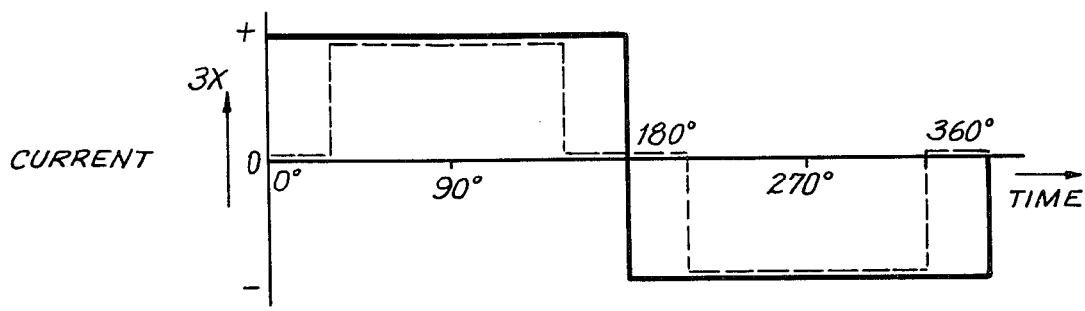
FIGS. 5A and 5B are graphical presentations of square wave currents supplied to the drive coils of the magnetic bubble device of FIGS. 2A and 2B.
Figure 5B:
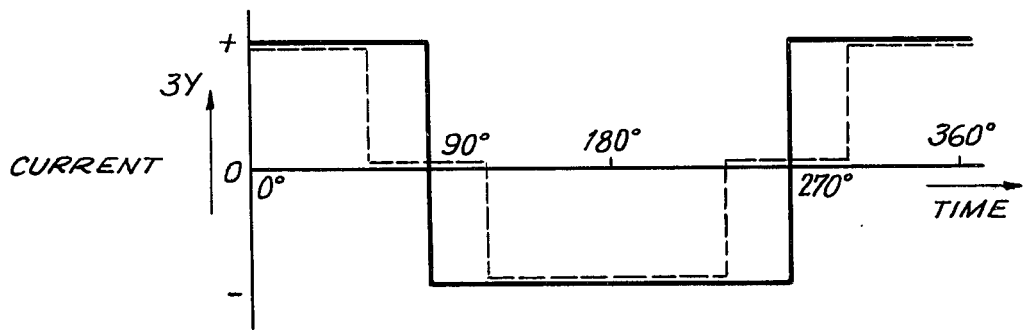
Figure 5C:
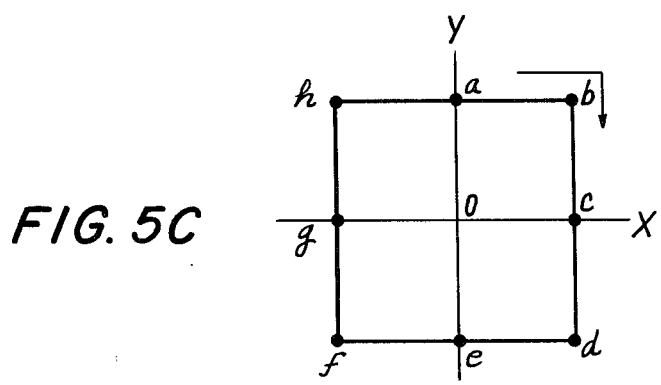
FIG. 5C shows the locus of the square rotating magnetic field produced by the waveforms of FIGS. 5A and 5B.

FIGS. 5A, 5B and 5C show square wave currents supplied to the drive coils. The square wave currents shown in FIGS. 5A and 5B are supplied to the coils 3X and 3Y, respectively. This produces the square rotating magnetic field, rotating clockwise, as shown in FIG. 5C. In an angular range of 0° to 90°, the magnetic field synthesized by the coils 3X and 3Y is located at a point $b$ in FIG. 5C. In angular ranges of 90° to 180°, to 180° to 270° and 270° to 360°, the location of the synthesized magnetic field is changed to points $d$, $f$ and $h$, respectively, of FIG. 5C. However, the locus of the rotating magnetic field induced by the square wave currents is characterized by the fact that the speed of the rotating magnetic field is not uniform.

When the square wave currents shown in FIGS. 5A and 5B are supplied to the coils 3X and 3Y, the locus of the synthesized magnetic field immediately moves from the point $h$ to the point $b$ in FIG. 5C, when the phase of the current reaches zero, and stays at the point $b$ until the phase reaches 90°. When the phase of the current reaches 90°, the locus of the synthesized magnetic field is changed to the point $d$ and remains at the point $d$ until a 180° current phase is reached. Similarly, when the phase reaches 180° and 270°, respectively, the locus is changed to the points $f$ and $h$. When the phase reaches 360° or zero, the locus jumps to the point $b$.

As shown, the locus of the synthesized magnetic field repeats rapidly in changing and remaining stationary. When the square waveform is that shown by broken lines in FIGS. 5A and 5B, the locus of the synthesized magnetic field remains at the points $a$, $c$, $e$ and $g$ of FIG. 5C, in addition to the points $b$, $d$, $f$ and $h$. This step-like variation of the locus speed is not favorable for driving magnetic bubbles or magnetic bubble devices, because the transition of the locus speed is equivalent to high speed magnetization, or magnetization at high frequency, for Permalloy pattern and magnetic bubbles. If the mobility of the crystal and the magnetic characteristics of the Permalloy pattern are considered, the transition of the magnetic field very likely lowers the operating margin of the system at the instant of transition. The driving of the coils by square wave currents, which contain many harmonic components, is not favorable in terms of induction of noise, if sensing elements are to be positioned inside the drive coils.

The magnetic bubble device driver of the invention utilizes a pulse current drive system which simplifies the start, stop and reverse control of the magnetic bubble device, while retaining the speed of rotation of the rotating magnetic field. The aforedescribed defect of the square wave drive system is thus corrected and the locus of the synthesized magnetic field is varied linearly.

Figure 6A:
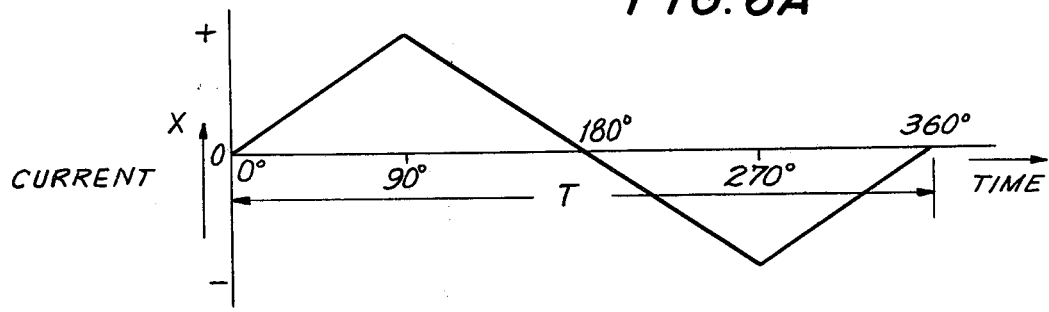
FIGS. 6A and 6B are graphical presentations of triangular wave currents supplied to the drive coils of the magnetic bubble device of FIGS. 2A and 2B, in accordance with the invention.
Figure 6B:
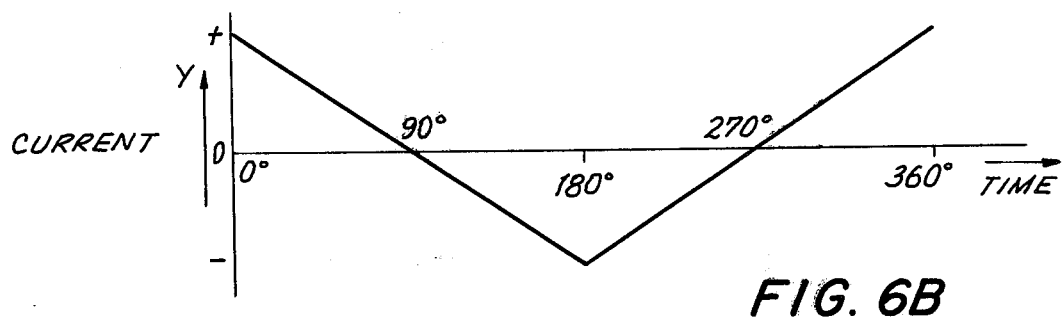

FIGS. 6A and 6B show triangular current waveforms supplied to the coils X and Y in accordance with the invention. FIGS. 6A and 6B also show the time relation of the triangular currents. The phase of the positive and negative half wave currents is shifted by T/2 in FIGS. 6A and 6B. T is a single period of the waveform. The rise time and fall time of the half wave currents is T/4. Therefore, the phase of the triangular current supplied to the X coil 2X is shifted by T/4, or 90°, from the triangular current supplied to the Y coil 2Y.

A square rotating magnetic field, having corner points at 0°, 90°, 180° and 360° is produced by supplying the 90° phase-shifted triangular currents to the coils 2X and 2Y. The parameters which determine the amplitude of the magnetic field are not limited to the amplitude of the drive currents, but include the number of turns of the coils and the permeability of their cores. In some cases, positive and negative amplitudes of the triangular current will have to be determined considering these parameters, and may result in different positive and negative amplitudes. The triangular currents have considerably less harmonics and distortion than the square wave currents shown in FIGS. 5A and 5B.

Figures 7A, 7B, 7C, 7D, 7E, 7F:
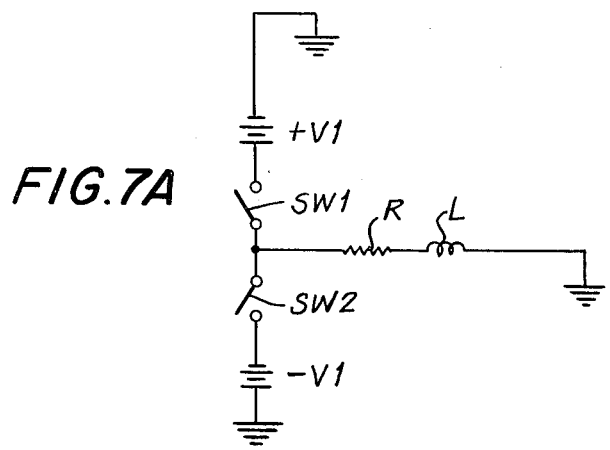
FIG. 7A is a circuit diagram illustrating the basic principles of the magnetic bubble device driver circuit of the invention.
FIGS. 7B to 7F are graphical presentations of waveforms appearing at different points of the circuit of FIG. 7A.

The production of a rotating magnetic field having a square locus by utilizing triangular current, in accordance with the invention, requires constant current drivers or driver circuits, in a strict sense. However, a constant current driver circuit may be practically approximated by a simple constant voltage driver circuit which permits the circuit to be considerably simplified. FIG. 7A illustrates the basic principles of the driver circuit of the invention. The circuit of FIG. 7A concerns the X coil only. However, the principle is identical for the Y coil, except that the phase of the supply current is shifted by 90° relative to the current supplied to the X coil.

The circuit of FIG. 7A comprises switches SW1 and SW2, and resistance R and inductance L of the X coil. Positive and negative electrical energy are provided by batteries +V1 and −V1, respectively. FIGS. 7B an 7C show the switches SW1 and SW2 turned ON and OFF. FIGS. 7D and 7E show the current waveforms supplied to the switches SW1 and SW2, respectively. FIG. 7F shows the current waveform flowing through the resistance R and the inductance L.

When the switch SW1 is closed at a time t1, voltage is applied from the positive power supply +V1 to the series circuit of R and L. The amplitude of the current to R and L is increased approximately linearly, if the duration of the ON time of the switch SW1 is set sufficiently smaller than the time constant L/R of the coil. The time constant of the coil is, for example, 0.1 to 0.2 × L/R. The switch SW1 is opened and the switch SW2 is closed at the time $t2$, when the amplitude of the current to the X coil reaches a level Im, at which the induced magnetic field may drive the magnetic bubble. The current to the X coil then decreases approximately linearly in accordance with a similar principle. At the time $t3$, the current amplitude reaches zero, and at the time $t4$ it reaches −Im. By repeating these steps for the switches SW1 and SW2, the current shown in FIG. 7F flows through the series circuit of R and L.

The rotation of the rotating magnetic field is started or stopped by simply starting or stopping the ON and OFF conditions of the switches SW1 and SW2. The rotation of the rotating magnetic field is reversed by reversing the T/4 phase shift of the switching of the switches SW1 and SW2. Thus, for example, when a control signal to a switch lags T/4 from that to the other switch, the control may be changed to a leading T/4. The switches SW1 and SW2 are electronic switches, and may be controlled automatically and simply, by a command or control signal.

FIG. 8A is a circuit diagram of an embodiment of the magnetic bubble device driver circuit of the invention. The magnetic bubble device driver circuit of FIG. 8A comprises a plurality of NPN transistors 1, 2, 3 and 4 and a plurality of diodes 5, 6, 7 and 8. The diodes 5 to 8 are connected to the transistors 1 to 4, respectively, with their polarities reversed. Thus, the diode 5 and the transistor 1 are connected in parallel with each other, and so on. One end of each of the coils X and Y is connected to a positive power supply terminal 15, or to a negative power supply terminal 16 via the parallel circuits 1, 5, or 2, 6 or the parallel circuits 3, 7 or 4, 8.

FIGS. 8B, 8C, 8D and 8E show the base input voltage waveforms of the transistors 1 to 4, respectively. FIGS. 8F, 8H, 8J and 8L show the collector current waveforms of the transistors 1 to 4. FIGS. 8G, 8I, 8K and 8M shows the current waveforms through the diodes 5 to 8. FIGS. 8N and 8P show the current waveforms I1 and I2 of the coils X and Y. The waveforms shown in FIGS. 8B to 8N and 8P are part of the signals required for a single period of the rotating magnetic field. When the magnetic bubble is to be moved continuously, the signal waveforms of FIGS. 8B to 8N and 8P are repeated as required.

The current I1 supplied to the coil X may be described as follows. When voltage waveform of FIG. 8B is applied to the base of the transistor 1, at the time $t1$, said transistor conducts to apply the voltage +V at the terminal 15 to the coil X. This produces an exponentially increasing current waveform which starts at the time $t1$. The current shown in FIG. 8F flows through the transistor 1 and a current similar to the current I1 flows to the coil X. The transistor 1 is cut off at the time $t2$. At such time, electromagnetic energy stored in the coil X produces a voltage of reverse polarity across the coil X. The amplitude of this voltage is limited to finite value which is determined by the voltage −V1 at the terminal 16 and the diode 6. The current I1 supplied to the coil X, that is, the current of FIG. 8G through the diode 6 starts to decrease exponentially until it reaches zero at the time $t3$.

When the voltage waveform of FIG. 8C is applied to the base of the transistor 2, at the time $t3$, the transistor 2 conducts and applies the voltage −V1 at the terminal 16 to the coil X. The current I1 of the diode 8 increases exponentially toward the negative direction in accordance with the aforedescribed principle. The increase of positive and negative coil currents can become approximately linear, if the time $to = t2 − t1 = t3 − t2 = t4 − t3$ . . . is sufficiently smaller than time constant $\tau$ of the coil, as mentioned. As the time $to$ is set closer to $\tau$, the linearity of the current is lost and the current waveform will trace a curve.

An approximately triangular current can be supplied to the coil X, as shown by the current I1 of FIG. 8N, by repeating the alternate turning ON and OFF of the switches SW1 and SW2. Similarly, a triangular current is supplied to the coil Y by controlling the operation of the transistors 3 and 4.

Figure 6C:
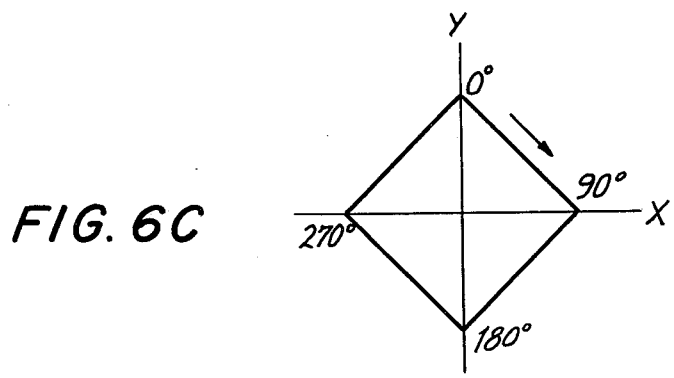
FIG. 6C illustrates the locus of the square rotating magnetic field produced by the waveforms of FIGS. 6A and 6B.

When the rotating magnetic field shown in FIG. 6C is to be produced by the cross-mounted coils 3X and 3Y of FIG. 3A, is is easily obtained by shifting the phase of the switches or transistors 1 to 4, so that current supplied to the coil 3X lags or leads the current supplied to the coil 3Y by one-fourth period.

In accordance with the invention, the transistors are operated in a saturated mode, so that there is very little consumption of power. In other words, the power consumed by a transistor is the product of the collector-emitter saturation voltage $V_{CES}$ of the transistor and the collector current at saturation. When the transistor is saturated, the amplitude of the voltage $V_{CES}$ is very small. The power consumption of a diode is also determined by product of its very small forward voltage VF and the amplitude of the triangular current. In addition, the current flows through the transistor or diode for only one-fourth period of the cycle of operation. Thus, the power consumption of the transistors and diodes is very low. This fact permits the use of small-sized transistors and diodes, resulting in a very compact circuit installation. Additional advantages are due to the fact that the transistors 1 to 4 are turned ON or OFF when the collector current is zero, resulting in very short switching times required for the transistors and permitting operation of the switches at very high speed. Furthermore, the transistors 1 to 4 may be turned ON while the drive current is in the drive coil, that is, before the coil current reaches zero. During this period, the turning ON of the transistor does not affect the current waveform flowing through the drive coil. This is useful in facilitating the selection of switch timing.

In the circuit of FIG. 8A, electromagnetic energy is stored in each coil due to the control of the transistors 1 to 4, so that currents flow to the coils X and Y and are recovered at the terminals 15 and 16 through the diodes 5 to 8. Thus, the power consumed in the driver circuit, when viewed from the terminal 15 or 16, is limited to that consumed by the transistors and diodes. However, the power consumption by these components is as small as described. Thus, the total power consumption of the driver circuit of the invention may also be very low.

Figure 9:
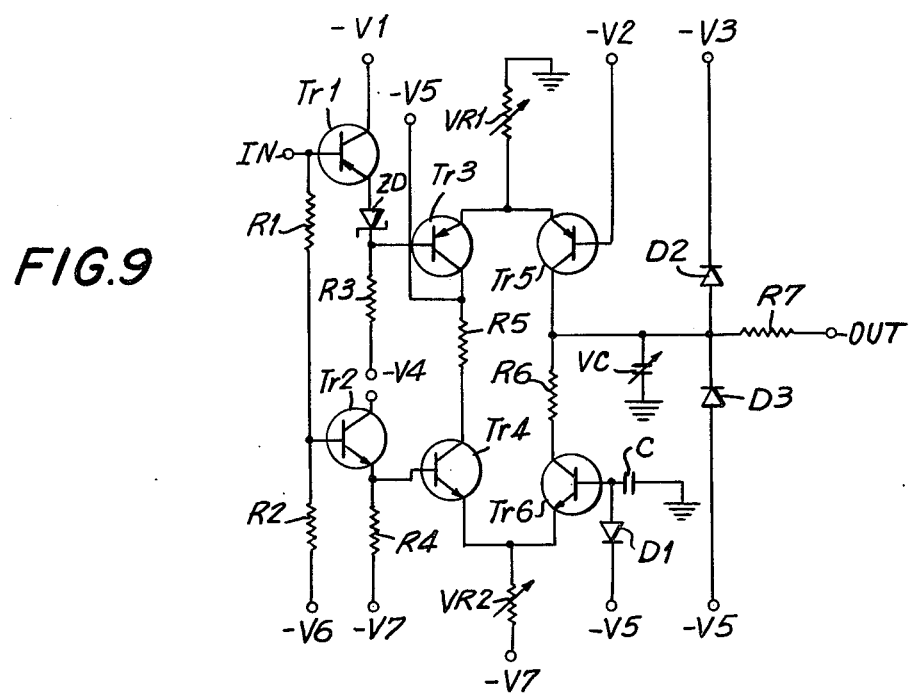
FIG. 9 is a circuit diagram of an embodiment of the circuit enclosed by broken lines in FIG. 8A.

FIG. 9 is a circuit diagram of a trapezoidal or triangular wave generator, shown by broken lines in FIG. 8A. The circuit of FIG. 9 comprises transistors Tr1, Tr2, Tr3, Tr4, Tr5 and Tr6, resistors R1, R2, R3, R4, R5, R6 and R7, variable resistors VR1 and VR2, a variable capacitor VC, a zener diode ZD and a capacitor C. Voltages −V1, −V2, −V3, −V4, −V5, −V6 and −V7 are provided.

Figure 10A:
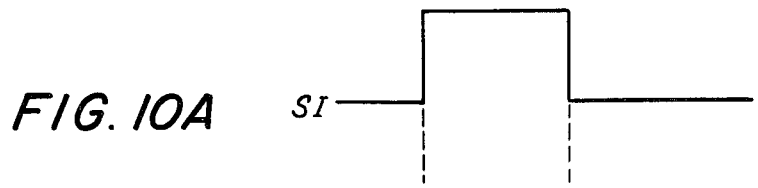
FIGS. 10A and 10B are graphical presentations of the input and output voltage waveforms of the circuit of FIG. 9.
Figure 10B:
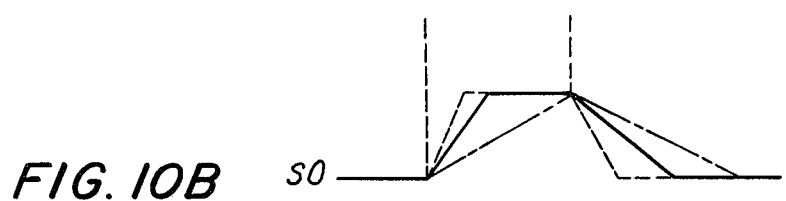

When a square wave voltage SI, shown in FIG. 10A, is applied to an input terminal IN, a trapezoidal output voltage S0, shown in FIG. 10B, is provided at the output terminal OUT. The rise of the voltage is determined by the time constant (VR1) (VC), and the decline of the voltage is determined by the time constant (VR2) (VC). Therefore, the circuit of FIG. 9 generates any desired form of trapezoidal wave, with equal rise and fall or different rise and fall. The circuit also generates a waveform having a moderate rise and no flat portion at top, shown as a triangular wave by dot and dash lines in FIG. 10B.

The sequence of operation of the circuit of FIG. 9 is as follows. Transistor pairs Tr3-Tr5 and Tr4-Tr6, respectively, form a differential amplifier which is used as a constant-current charging and discharging gate for the variable capacitor VC. When the square wave input voltage SI is applied to the input terminal IN, the emitter voltage of the transistor Tr1 increases. When this voltage exceeds the reference voltage −V2, the transistor Tr3 is cut off and the transistor Tr4 conducts, forming a constant-current charging circuit. It increases the potential of the capacitor VC, but the final charging voltage is limited by the diode D2 which conducts when the voltage level −V3 is reached.

When the square wave input voltage SI changes to zero, the transistors Tr2 and Tr4 are cut off and the transistor Tr6 conducts, instead. This results in the discharging of the capacitor VC. When the terminal voltage reaches −V5 or lower, the diode D3 conducts and stops a further voltage decrease across the capacitor. When trapezoidal currents, produced by the aforedescribed steps, are supplied to the coils X and Y, with an adequate phase shift between the current supplied to the coil X and the current supplied to the coil Y, the locus of the rotating magnetic field is rectangular, as shown in FIG. 5C.

The speed of rotation of the rotating magnetic field is uniform. There is no point of the locus which remains still and the amplitude of the magnetic field varies linearly. The locus of the rotating magnetic field, as mentioned, insures a sufficient operating margin for the behavior of the magnetic bubble, similar to the sine wave drive of the bubble.

FIGS. 11A and 11B illustrate the triangular current waveform supplied to the coils X and Y of FIG. 8A. The duty cycle of the triangular current I1 and I2, shown in FIGS. 8N and 8P, is reduced. FIG. 11C illustrates the locus of the rotating magnetic field produced when the triangular currents, phase-shifted as shown in FIGS. 11A and 11B, are supplied to the coils X and Y. The locus resembles an asteroid.

Power loss of the driver of the invention is decreased by reduction of the duration of the currents supplied to the coils, as shown in FIGS. 11A and 11B. If the principal concern is simply to reduce the power loss of the driver circuit, the duration of the coil currents may be reduced further. Thus, for example, a cross-like locus may be provided for the rotating magnetic field by considering the time relation between the currents supplied to the coils X and Y, shown in FIGS. 11A and 11B, so that overlapping areas or regions of the two currents at $2\pi/10$ to $3\pi/10$, $7\pi/10$ to $8\pi/10$, $12\pi/10$ to $13\pi/10$ and $17\pi/10$ to $18\pi/10$ are eliminated. In such operation, the duty cycles of the currents are reduced, resulting in significant savings in power consumption, power loss and heat radiation. However, the behavior of the magnetic bubble may become unstable.

As hereinbefore mentioned, the magnetic bubble is propagated by movement of the magnetic pole produced in the Permalloy pattern by the rotating magnetic field. If the locus of the rotary magnetic field is set to a cross-shape, there are time domains where the magnetic field is reduced to zero. Therefore, when a magnetic bubble is to be moved from a Permalloy pattern such as, for example, a T-shaped pattern, to another Permalloy pattern such as, for example, an I-shaped pattern, the attractive force operating between the T-shaped pattern and the magnetic bubble may be larger than that operating between the I-shaped pattern and the bubble, causing the magnetic bubble to fail to move to the I-shaped pattern. The cross-shaped locus of the rotating magnetic field may create an additional serious problem for a magnetic bubble provided by a Permalloy disc-type pattern on a magnetic bubble chip. In this case, further production of a magnetic bubble becomes impossible, that is, the writing of new data on the chip is impossible. Considering this effect, the embodiment of the locus of the rotating magnetic field shown in FIG. 11C is selected to be similar to an asteroid, wherein the amplitude of the magnetic field is stronger in directions corresponding to parts of the pattern on which the magnetic bubble may long remain, than in other intermediate directions.

Figure 13A:
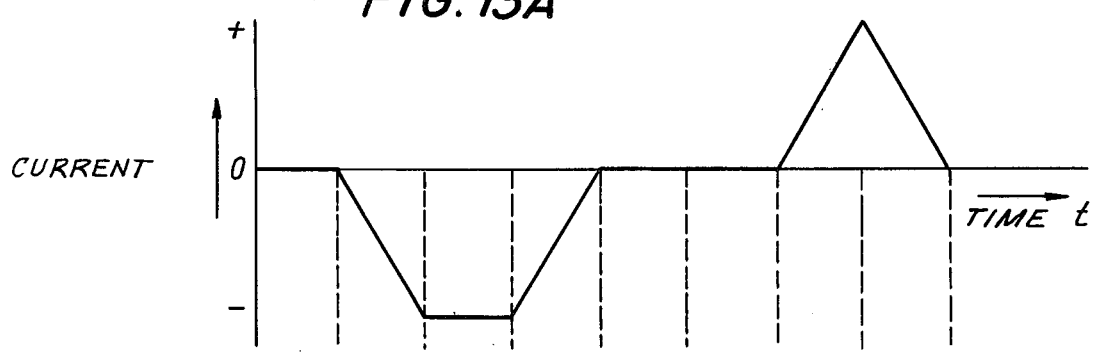
FIGS. 13A and 13B are graphical presentations of deformed triangular current waveforms supplied to the drive coils of a magnetic bubble device, in accordance with the invention.
Figure 13B:
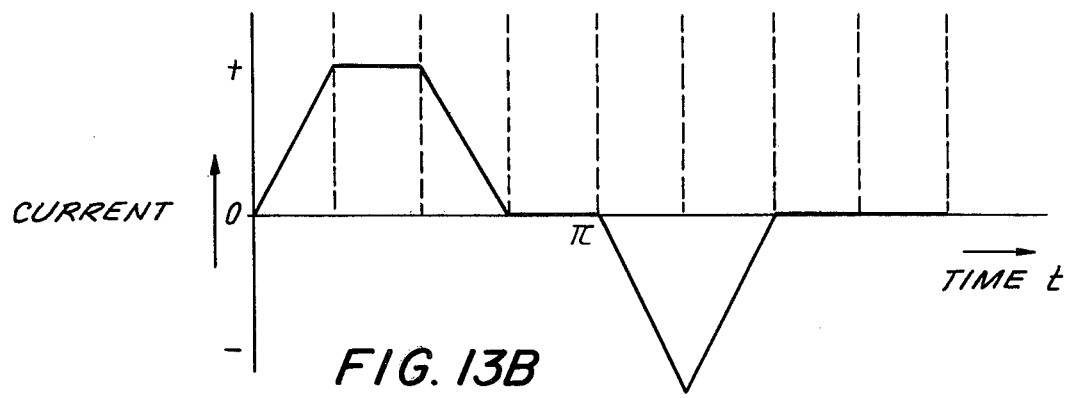
Figure 13C:
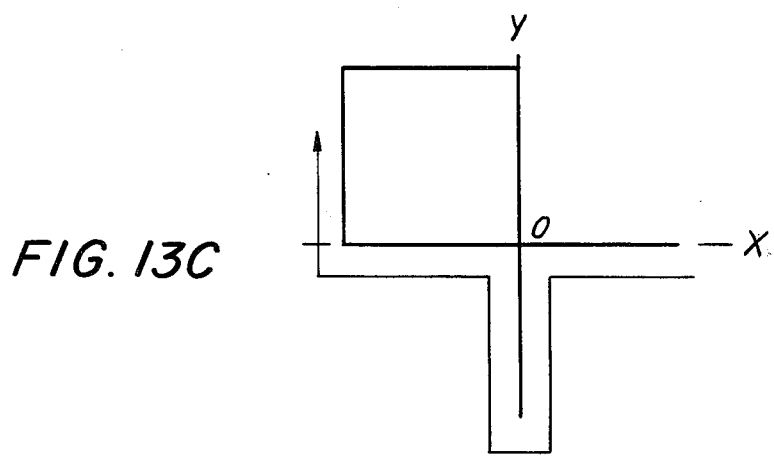
FIG. 13C shows the locus of the rotating magnetic field produced by the waveforms of FIGS. 13A and 13B.

If the Permalloy patterns provide normal propagation of magnetic bubbles, the rotating magnetic field may be designed for a magnetic bubble generator mounted on a magnetic bubble chip, so that the amplitude of the output magnetic field may be increased sufficiently for movement of the magnetic bubble in a time period in which a magnetic bubble is generated. For this purpose, the locus of the rotating magnetic field may be changed so that it has a large amplitude in a time period in which the magnetic bubble is divided from the generator pattern to the propagation pattern and the amplitude is less in other time periods. A locus of a rotating magnetic field design based on this point is shown in FIGS. 12C and 13C. In these loci, the magnetic field components are added to a cross-shaped locus so that the magnetic bubble is provided with a transient state when it is changed from the generator pattern to the propagation pattern. A locus of this type may be produced by supplying the currents shown in FIGS. 12A and 12B or the currents shown in FIGS. 13A and 13B to the coils X and Y of FIG. 8A. The currents shown in FIGS. 12A, 12B, 13A and 13B may be produced by controlling the operation of the switches 1, 2, 3 and 4 of the circuit of FIG. 8A.

Figure 14:
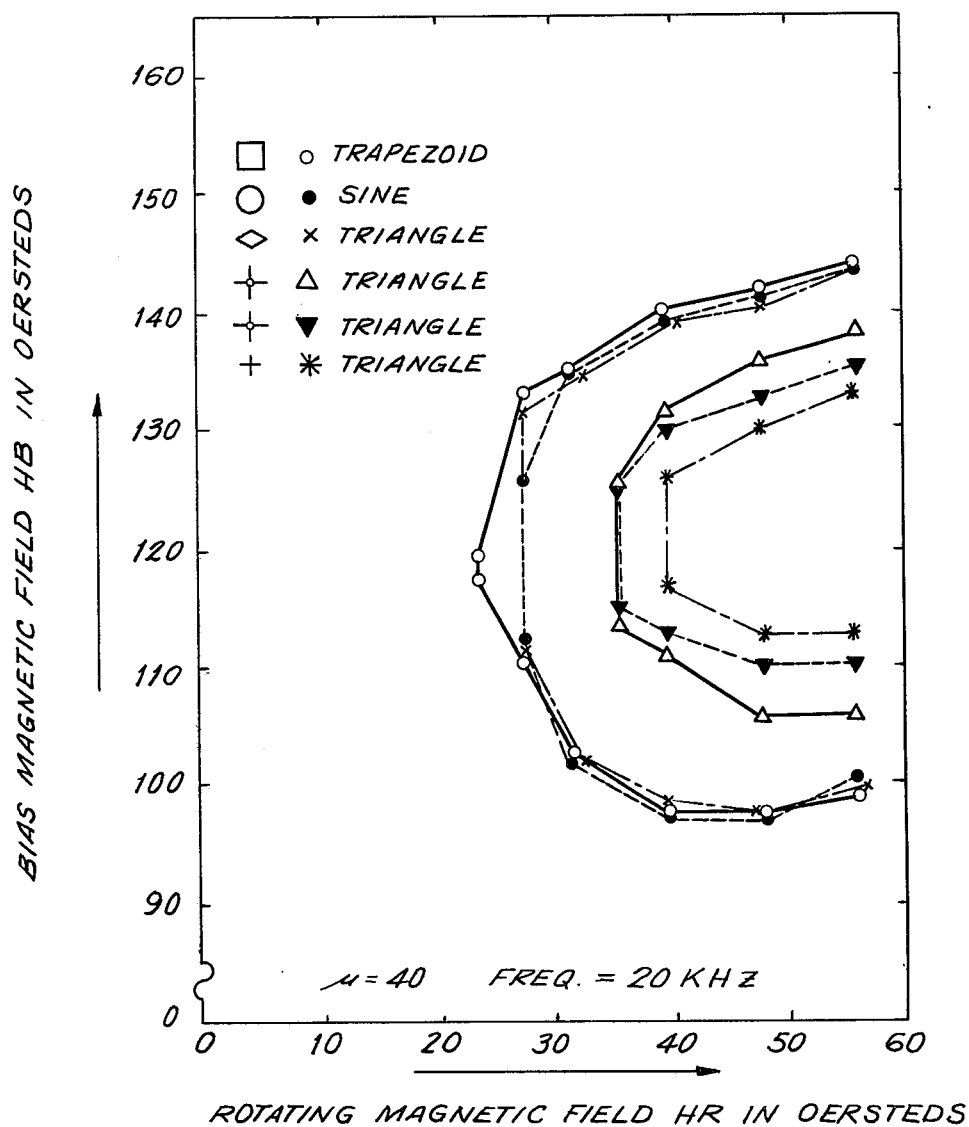
FIG. 14 are graphical presentations comparing the operating margin characteristics of the locus of the rotating magnetic field produced by the driver of the present invention with the locus of the magnetic field produced by a sine wave current drive.

FIG. 14 compares the margin characteristics of the rotating magnetic fields produced by drivers in accordance with the present invention with those of the conventional circular rotating magnetic field produced by a sine wave drive. In FIG. 14, the rotating magnetic field is shown on a horizontal axis and the amplitude of the bias magnetic field is shown on a vertical axis.

In FIG. 14, the operating margin obtained from a sine wave driven circular locus is plotted with a black dot and that obtained from a square rotating magnetic field driven by a square wave current is plotted with a hollow dot. The curves plotted with x's, hollow triangles, black triangles and asterisks are the operating margin driven by a square asteroid locus produced by triangular wave currents of different duty cycles and that driven by a cross-shaped locus, respectively. The drive frequency is set at 20 kHz, equal for all the curves. As shown by the curves of FIG. 14, the driver circuit of the invention provides a uniform speed of rotation for the rotary magnetic field and linear variation for the locus thereof, and has substantially equal margin characteristics compared with that of the conventional drive using sine wave currents.

The magnetic bubble device driver circuit of the invention provides very easy and stable start, stop, reverse, or other control, for a rotating magnetic field. The driver circuit of the invention also insures sufficient margin characteristics, considerable savings in power consumption and considerably simplified circuit configuration.

While the invention has been described by means of a specific example and in a specific embodiment, we do not wish to be limited thereto, for obvious modifications will occur to those skilled in the art without departing from the spirit and scope of the invention.

We claim:

1. A magnetic bubble device driver for a magnetic bubble device having a magnetic bubble chip consisting of magnetic material for producing a magnetic bubble, said magnetic bubble chip having a surface, and at least a pair of drive coils crossing each other for producing a rotating magnetic field substantially parallel to the surface of the magnetic bubble chip, said magnetic bubble device driver comprising circuit means for supplying drive currents to each of the drive coils of a magnetic bubble device, said drive currents respectively having predetermined waveshapes and producing magnetic fields each of which varies linearly whereby said magnetic fields produce a rotating magnetic field rotating at a uniform constant speed for driving the magnetic bubble of the magnetic bubble device.

2. A magnetic bubble device driver as claimed in claim 1, wherein the circuit means produces out-of-phase trapezoidal currents of said predetermined waveshapes whereby said rotating magnetic field has a rectangular locus.

3. A magnetic bubble device driver as claimed in claim 1, wherein the circuit means produces out-of-phase triangular currents of said predetermined waveshapes whereby said rotating magnetic field has a rectangular locus.

4. A magnetic bubble device driver as claimed in claim 1, wherein the circuit means comprises a pair of circuit networks each connected to a corresponding one of the coils and each comprising first and second switching means, a source of positive voltage, a source of negative voltage and electrically conductive means connecting the source of positive voltage to the corresponding coil via the first switching means and connecting the source of negative voltage to the corresponding coil via the second switching means, said first and second switching means alternately connecting the sources of positive and negative voltage to the corresponding coil and utilizing specific approximately linear voltage-current characteristics of the corresponding coil.

* * * * *